United States Patent
Shute

(10) Patent No.: US 10,075,134 B2
(45) Date of Patent: Sep. 11, 2018

(54) DELAY ADJUSTMENT

(71) Applicant: SnapTrack, Inc., San Diego, CA (US)

(72) Inventor: Nicholas Shute, Cambridgeshire (GB)

(73) Assignee: SNAPTRACK, INC., San Diego, CA (US)

( * ) Notice: Subject to any disclaimer, the term of this patent is extended or adjusted under 35 U.S.C. 154(b) by 37 days.

(21) Appl. No.: 14/892,501

(22) PCT Filed: May 22, 2014

(86) PCT No.: PCT/EP2014/060581
§ 371 (c)(1),
(2) Date: Nov. 19, 2015

(87) PCT Pub. No.: WO2014/187918
PCT Pub. Date: Nov. 27, 2014

(65) Prior Publication Data
US 2016/0094185 A1 Mar. 31, 2016

(30) Foreign Application Priority Data
May 22, 2013 (GB) .................................. 1309236.6

(51) Int. Cl.
*H03G 3/30* (2006.01)
*H03F 1/02* (2006.01)
(Continued)

(52) U.S. Cl.
CPC ......... *H03F 1/0211* (2013.01); *H03F 1/0222* (2013.01); *H03F 3/19* (2013.01);
(Continued)

(58) Field of Classification Search
CPC ........ H03F 1/0211; H03F 1/0222; H03F 3/19; H03F 3/21; H03F 2200/102;
(Continued)

(56) References Cited

U.S. PATENT DOCUMENTS 7,212,791 B2 * 5/2007 Arayashiki ........... H03F 1/0222
375/300
7,372,917 B2 * 5/2008 Jensen ..................... H03C 5/00
375/296
(Continued)

FOREIGN PATENT DOCUMENTS

CN 1692558 A 11/2005
CN 1701521 A 11/2005
(Continued)

OTHER PUBLICATIONS

International Search Report and Written Opinion—PCT/EP2014/060581—ISA/EPO—Aug. 26, 2014.

*Primary Examiner* — Khanh V Nguyen
(74) *Attorney, Agent, or Firm* — Patterson & Sheridan, L.L.P.

(57) ABSTRACT

There is disclosed an envelope tracking amplification stage comprising an input path and an envelope path and a delay stage in one of the input path and the envelope path, the delay of the delay stage being determined in dependence on the slope polarity of a signal representing the input and whether the signal in the input path leads or lags the signal in the envelope path.

14 Claims, 4 Drawing Sheets

(51) Int. Cl.
*H03F 3/19* (2006.01)
*H03F 3/21* (2006.01)

(52) U.S. Cl.
CPC .............. *H03F 3/21* (2013.01); *H03F 1/0227* (2013.01); *H03F 1/0244* (2013.01); *H03F 2200/102* (2013.01); *H03F 2200/451* (2013.01); *H03G 3/30* (2013.01); *H03G 3/3005* (2013.01); *H03G 3/3015* (2013.01)

(58) Field of Classification Search
CPC ................ H03F 1/0227; H03F 1/0244; H03F 2200/504; H03G 3/20; H03G 3/3042; H03G 3/3036; H03G 3/3047; H03G 3/30; H03G 3/3005
USPC .......................... 330/136, 127, 129, 280, 297
See application file for complete search history.

(56) References Cited

U.S. PATENT DOCUMENTS

| | | | |
|---|---|---|---|
| 8,532,223 B2* | 9/2013 | Nagatani | H03F 1/0222 375/297 |
| 8,558,614 B2* | 10/2013 | Masuda | H03G 3/3042 330/136 |
| 8,718,579 B2* | 5/2014 | Drogi | H04B 1/0475 375/296 |
| 8,854,129 B2 | 10/2014 | Wilson | |
| 2005/0079835 A1* | 4/2005 | Takabayashi | H03G 3/3042 455/127.1 |
| 2010/0237397 A1 | 9/2010 | Uchiyama | |
| 2010/0237937 A1 | 9/2010 | Nagatani et al. | |
| 2011/0316623 A1 | 12/2011 | Bohn et al. | |
| 2014/0097893 A1* | 4/2014 | Ajima | H03F 3/245 330/136 |

FOREIGN PATENT DOCUMENTS

| | | |
|---|---|---|
| CN | 101841305 A | 9/2010 |
| CN | 102308473 A | 1/2012 |
| WO | 2011128341 A1 | 10/2011 |
| WO | 2012164951 A1 | 12/2012 |

* cited by examiner

DELAY ADJUSTMENT

BACKGROUND TO THE INVENTION

Field of the Invention

The present invention relates to the control of signals in an envelope tracking amplification stage.

Description of the Related Art

Envelope tracking amplification stages are well-known in the art, in which a power supply to a power amplifier is controlled to be based upon the envelope of an input signal to be amplified. The power amplifier receives the input signal to be amplified, and in addition receives a power supply which is modulated in dependence upon the envelope of the input signal to be amplified. An amplified output signal is thus generated in an efficient way.

It is known in the art to provide processing in the envelope path in order to shape the envelope signal which controls a modulator for generating a power supply for the power amplifier.

It is also known in the prior art to provide delays in either the input path to the power amplifier or the envelope path for the supply to the power amplifier, in order to ensure that the instantaneous power supply delivered to the power amplifier corresponds to the instantaneous level of the input signal.

For the purposes of discussion it is assumed that there is no inherent delay difference between the envelope and (RF) input paths.

When an RF envelope has a positive slope, a delay in the supply voltage means that the supply voltage is a little below the desired target level, therefore preventing the RF output envelope from reaching its target as the output is similarly a little low. On the same basis, when the RF envelope has a negative slope, a delay in the supply voltage means that the RF output envelope is slightly too high.

If a delay is applied to the RF envelope signal, then when the RF envelope has a positive slope, the delay in the supply voltage means that it is a little above target, therefore forcing the RF output envelope to be above its target. On the same basis, when the RF envelope has a negative slope, the delay in the supply voltage means that the RF output envelope is slightly too low.

It is an aim of the present invention to provide a basis for controlling a delay applied in an envelope tracking amplification stage to improve efficiency.

SUMMARY OF THE INVENTION

In one aspect the invention provides an envelope tracking amplification stage comprising an input path and an envelope path and a delay stage in one of the input path and the envelope path, the delay of the delay stage being determined in dependence on the slope polarity of a signal representing the input and whether the signal in the input path leads or lags the signal in the envelope path.

Whilst it is required to identify the slope of the current signal being amplified, this can be determined based on the slope of a number of different signals, and preferably signals which are derived directly from the input signal. Whilst this slope can be determined based on the input signal itself, it can also be determined for example based on the envelope signal or the output signal of the amplifier.

Whether the signal in the input path leads or lags the signal in the envelope path can be determined by comparing a number of different signals, and preferably signals derived from or representing the signals in the input path and the envelope path. Any signals which represent the timing of the signals in the envelope path and the input path, for example, can be compared.

The slope polarity of the signal representing the input may be determined by determining the slope polarity of any one of the signals in the input path, the envelope path or the output path.

The slope polarity of the signal representing the input may be determined in dependence on a portion of the input signal which is not a minima or a maxima of the input signal.

It may be determined whether the signal in the input leads or lags the signal in the envelope path by comparing the instantaneous signal amplitude to an average signal amplitude.

The average amplitude may be selected in dependence on the polarity of the slope.

It may be determined whether the signal in the input path leads or lags the signal in the envelope path by comparing the instantaneous signal gain to the average signal gain. The average gain may be selected in dependence on the polarity of the slope.

The invention also provides a method for determining the delay in an input path or an envelope path of an envelope tracking amplification stage comprising determining the slope polarity of a signal representing the input and determining whether the signal in the input path leads or lags a signal in the envelope path.

Determining the slope polarity of the signal representing the input may comprise determining the slope polarity of any one of the signals in the input path, the envelope path or the output path.

Determining the slope polarity of the signal representing the input may be based in dependence on a portion of the input signal which is not a minima or a maxima of the input signal.

Determining may comprise whether the signal in the input leads or lags the signal in the envelope path by comparing the instantaneous signal amplitude to an average signal amplitude. The average amplitude may be selected in dependence on the polarity of the slope.

The method may further comprise determining whether the signal in the input path leads or lags the signal in the envelope path by comparing the instantaneous signal gain to the average signal gain. The average gain may be selected in dependence on the polarity of the slope.

BRIEF DESCRIPTION OF THE FIGURES

The invention is now described by way of example with reference to the accompanying Figures, in which.

DESCRIPTION OF THE PREFERRED EMBODIMENTS

The invention is now described by way of example with reference to particular embodiments and exemplary implementations. The invention is not limited to the details of any described embodiments or exemplary implementations.

In accordance with the present invention a delay of a delay stage in the envelope path or the input path of an envelope tracking power amplification stage is controlled in order to improve the linearity performance of the system. Specifically, the AM/AM performance of the system is improved, which translates to adjacent channel spectral performance.

In order to control the delay in the input path or the envelope path, it is necessary to determine whether the slope of the input is increasing or decreasing (i.e. positive or negative). It is further necessary to determine whether an error exists, by determining whether there is a time difference between the input signal and the envelope signal.

In order to determine whether the slope of the input signal is increasing or decreasing, information can be obtained for example from the input signal, the envelope signal, the supply signal, or the output signal. In certain circumstances, it may be necessary to ensure a determination is made in a portion of the input cycle outside the maxima and minima of the input signal.

In order to determine any error, it is possible to look at one signal—such as the input signal or output signal—and compare that to an average or mean for that signal. If a signal leads or lags the mean this provides an indication of the error, i.e. the size of the delay.

In addition, the actual size of the error can optionally be determined if required, to give the actual amount by which the delay should charge.

Thus, in general, whether the signals are increasing or decreasing can be determined by determining whether one signal is increasing or decreasing. Potential errors can be avoided by preferably performing this determination is a portion of the waveform other than the maxima or minima. The direction of any error can be determined by comparing the timing of two signals or comparing the timing of one signal to the timing of the mean or average of that signal. The timing may not be directly compared: preferably only the timing information conveyed by the AM characteristics of the input and output signals is compared. Where the size of the error is required, the actual value of that error can be determined rather than merely its direction by measuring the difference between two signals, or between one signal and the mean.

Figure 1:
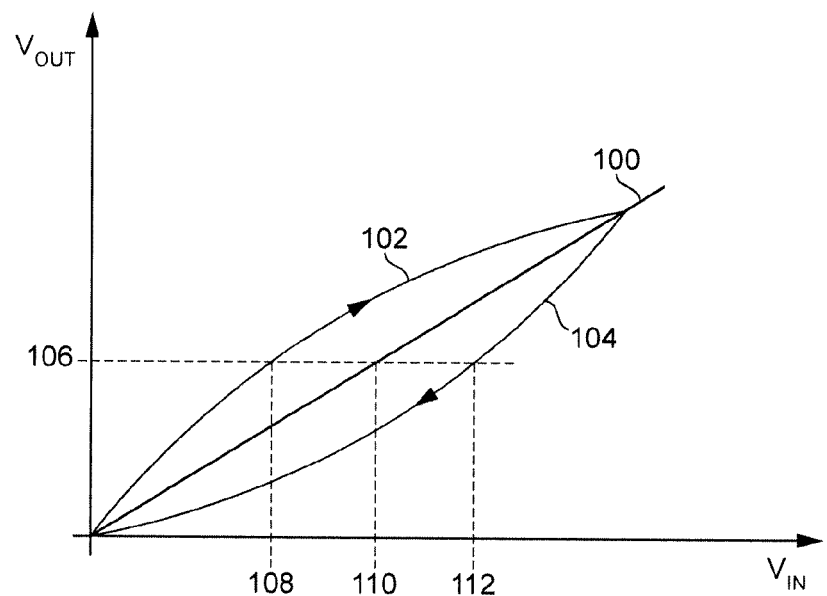
FIG. 1 illustrates a plot of $V_{OUT}$ against $V_{IN}$ when an error occurs due to the input to the RF amplifier being delayed relative to the reference signal.

With reference to FIG. 1, there is illustrated a plot for the power amplifier of output voltage ($V_{OUT}$) against input voltage ($V_{IN}$). The plot 104 illustrates the relationship between the power amplifier input and output signals for an increasing input when the input signal is delayed, and the plot 102 illustrates the relationship between the power amplifier input and output signals for a decreasing input when the RF input is delayed. The error between the signals for an increasing input as illustrated by plot 104 and the signals for a decreasing input as illustrated by the plot 102 can be understood with reference to FIG. 1 by comparing the mean waveform as illustrated by line 100.

For a given output voltage as denoted by reference numeral 106, for an increasing input the error in the input signal is represented by the difference between dash lines 110 and 112, and for a decreasing input the error is the difference between the dash lines 108 and 110.

Figure 2:
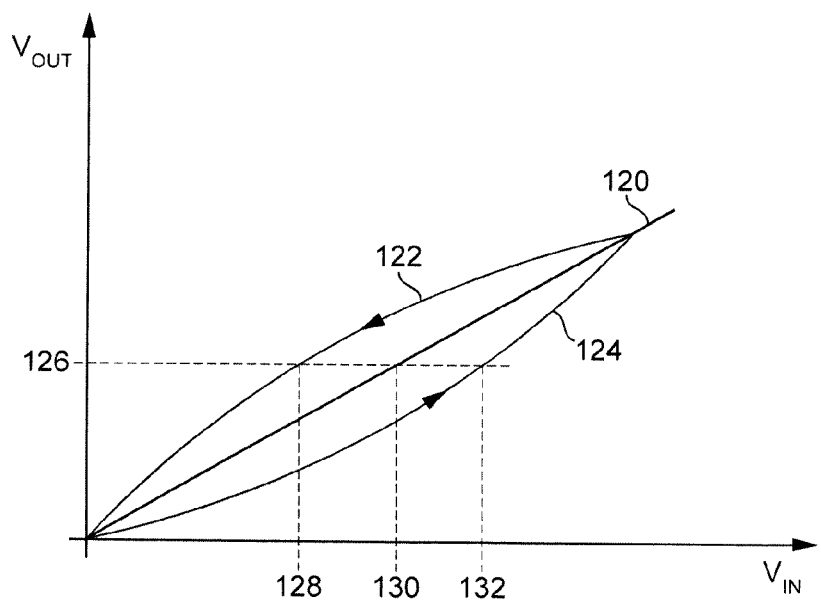
FIG. 2 illustrates a plot of $V_{OUT}$ against $V_{IN}$ when an error occurs due to the envelope signal being delayed relative to the RF input signal.

With reference to FIG. 2, there is illustrated a plot for the power amplifier of output voltage ($V_{OUT}$) against input voltage ($V_{IN}$). The plot 124 illustrates the relationship between the power amplifier input and output signals for an increasing input when the envelope signal is delayed, and the plot 122 illustrates the relationship between the power amplifier input and output signals for a decreasing input when the envelope signal is delayed. The error between the signals for an increasing input as illustrated by plot 124 and the signals for a decreasing input as illustrated by the plot 122 can be understood with reference to FIG. 2 by comparing the mean output as illustrated by plot 120.

For a given output voltage as denoted by reference numeral 126, for an increasing input the error in the input signal is represented by the difference between dash lines 130 and 132, and for a decreasing input the error is the difference between the dash lines 128 and 130.

In order to improve efficiency the exemplary implementation provides a technique for detecting the direction of delay. In order to detect the direction of the delay two determinations are required from the AM-characteristic (or the time delay signals) in the exemplary arrangement: i) the AM time-domain slope polarity (positive or negative); and ii) the instantaneous gain measurement (or a sample of gain measurement).

Figure 3:
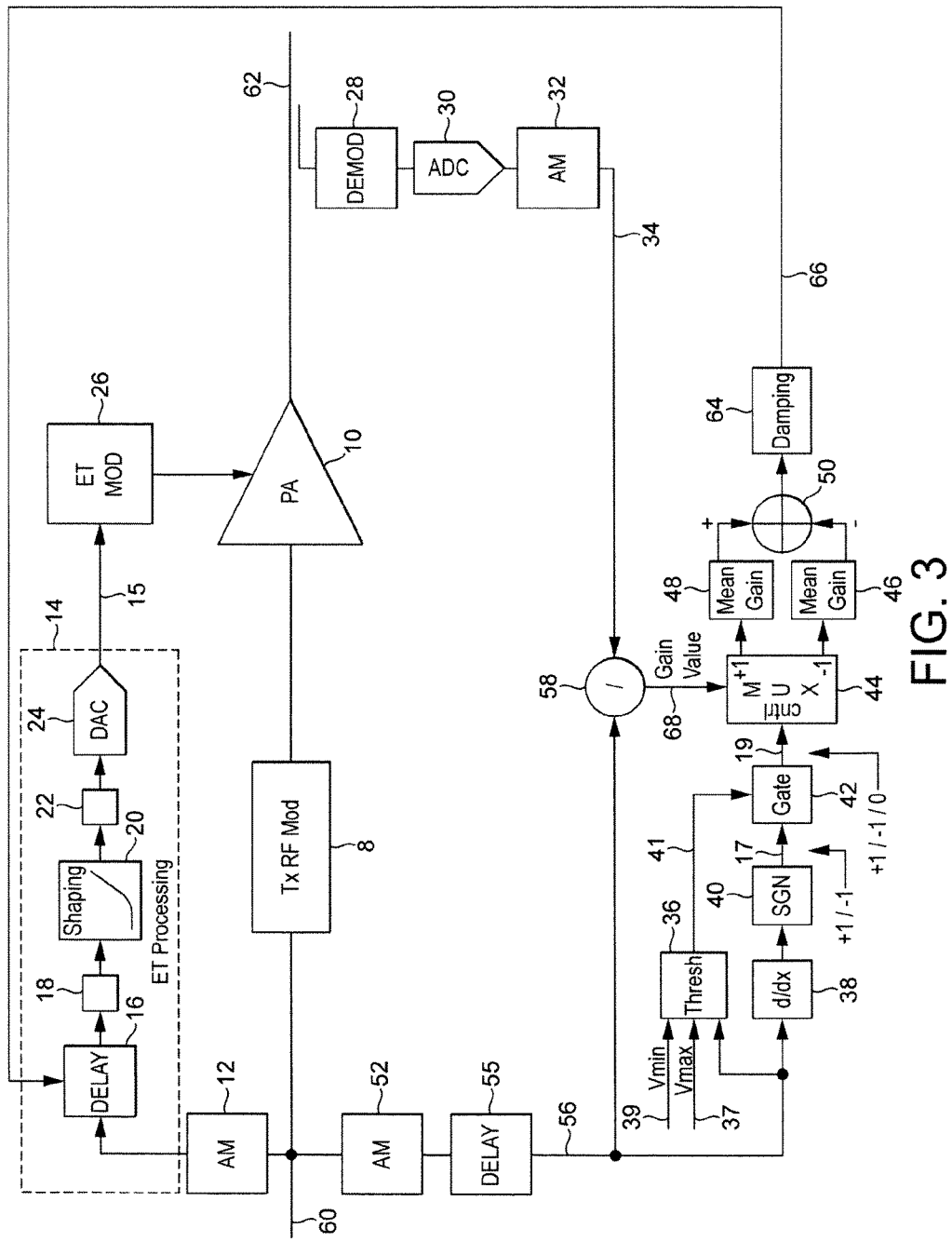
FIG. 3 illustrates an improved envelope tracking power amplification stage in accordance with one exemplary implementation.

With reference to FIG. 3 there is illustrated an exemplary implementation for detecting the direction of the delay error by detecting these two characteristics, and then using the thus detected direction of the delay to control a delay in the envelope signal.

With reference to FIG. 3 there is illustrated the basic elements of an amplification stage employing envelope tracking.

An input signal is provided on line 60. The input signal provides an input to a transmit RF modulator block 8, and the output of the transmit RF modulator block 8 is provided as an input to a power amplifier 10. An amplified version of the input signal is provided on line 62 of the output of the power amplifier 10. The transmit RF modulator block 8 will modulate the input signal on input line 60 and converts such input signal to an RF input signal.

In accordance with an envelope tracking architecture, the input signal on line 60 is also provided to an block 12 which provides an input to envelope circuitry 14. In accordance with known techniques an envelope signal on line 15 may be generated by the envelope circuitry 14, and the thus generated envelope signal on line 15 is used to control an envelope tracking modulator 26 to provide a modulated power supply to the power amplifier 10.

The envelope tracking circuitry 14 of the envelope tracking path may include a delay adjustment block 16, a pre-shaping gain and offset block 18, a shaping block 20, a post-shaping gain and offset block 22, and a DAC (digital to analogue converter) block 24.

In accordance with the improvement, the delay block 16 receives a control signal on line 66 as will be described further hereinafter. It should be noted this is an exemplary arrangement for illustration, and alternatively or in addition a variable delay controlled in accordance with the following techniques may be provided in the input path to the RF amplifier.

The additional circuitry of FIG. 3 is provided in order to give the improvement to enable detection of the direction of a delay error in order to control the delay applied in the variable delay block 16.

The input signal on line 60 is provided as an input to an AM block 52. The AM block 52 corresponds to the AM block 12, and simply provides at its output a signal representing the amplitude of the input signal on line 60.

The output of the AM block 52 is delivered to the input of a delay block 54, and the output of the delay block 54 provided on line 56 as a first input to a comparator 58. The delay block 54 is provided in order to simulate any delay in the envelope tracking amplification circuitry between the input on line 60 and the output on line 62 of such stage, such that the signal on line 56 provided as an input to comparator 58 is synchronised in time with a signal on line 34 provided to a second input of the comparator 58 which is generated in dependence upon the output of the power amplifier 10.

The signal on line 34 providing a second input to the comparator 58 which is generated in dependence upon the output of the power amplifier 10 is generated by a demodulator block 28, an analogue-to-digital conversion block 30, and an block 32. The demodulator block 28 detects the RF output signal on the output line 62 of the power amplifier 10, and demodulates that signal. The demodulated signal is converted into digital form by the block 30. The AM block 32 simply operates to provide an envelope representation of the RF output signal on line 62 as the signal on line 34 similar to the block 52.

The signal on line 34 is already provided for power control purposes, and there is no overhead associated with its provision for this arrangement.

The comparator 58 thus receives as a first input a signal on line 56 representing the input signal to the power amplification stage, and a signal on line 34 representing the output signal of the power amplifier stage. As mentioned above the delay stage 54 is provided in order to synchronise such signals, such that the comparator 58 is effectively comparing instantaneous values of such signals.

The output of the comparator on line 68 provided by the comparator 58 provides a comparison between the output and the input of the power amplifier stage, and thus provides an indication of the gain of the power amplifier stage. The signal on line 68 is therefore a "gain value" signal. The output of the comparator 58 on line 68 forms an input to a multiplexer 44.

The signal on line 56 representing the magnitude of the input to the power amplification stage is additionally provided as an input to a threshold block 36 and a differentiator block 38.

The threshold block 36 additionally receives a maximum voltage signal on line 37 and a minimum voltage signal on line 39, and generates an output signal on line 41. The threshold block 36 is provided to ensure that the circuitry for controlling the adjustment of the delay is operational only if the input signal is greater than a certain value ($V_{max}$) or less than a certain value ($V_{min}$). This prevents the circuitry from being operational at minimum or maximum peaks (minima or maxima) of the input signal where amplitude information may be inaccurate. The threshold block 36 thus basically disables the operation of the circuitry at minima and maxima of the input signal. The setting of the values Vmin and Vmax may be implementation dependent, and may be dynamic.

These thresholds additionally limit the decision making to a small range of amplitude levels where the spread of AM/AM is widest.

The thresholds may be applied to the output signal rather than the input signal.

As shown in FIG. 1, the threshold block 36 compares the input signal on line 56 to the two threshold values, and uses its output on line 41 to only enable a gate 42 if the input signal amplitude is between the two threshold values.

The differentiator block 38 provides an output to a sign block 40, and the sign block 40 provides a sign at its output on line 17 indicating either a positive or a negative.

The differentiator block 38 and the sign block 40 operate to generate a positive or a negative indication on line 17 in accordance with whether the slope of the input signal on line 56 is increasing or decreasing.

The gate 42 receives the output of the sign block 40 on line 17 and is also controlled to be enabled/disabled by the output of the threshold block 36 on line 41. When enabled the output of the gate 42 on line 19 will be the positive or the negative indication on line 17 (in accordance with the output of the sign block 40). When disabled the output of the gate 42 will be zero.

The output of the gate 42 provides a control input to the multiplexer 44. This control input will be "+1" indicating an input signal with an increasing slope, "−1" indicating an input signal with a decreasing slope, or "0" indicating disablement.

The multiplexer 44 additionally receives the "gain value" signal on line 68 as a further input.

The multiplexer 44 generates one of two output signals, a first output signal to a mean gain block 48 and the second output signal to a mean gain block 46. The two outputs of the multiplexer correspond to the output of the gate being positive or negative. If the output of the gate 42 is positive the multiplexer 44 connects the gain value on line 68 to the mean gain block 48. If the output of the gate 42 is negative the multiplexer 44 connects the gain value on line 68 to the mean gain block 46.

The mean gain blocks 48 and 46 contain the mean gain values for, respectively, increasing and decreasing input slopes. The mean gain value in either block is updated to account for the current gain value at the output of the multiplexer, if the multiplexer provides a current gain value to one of the blocks 46, 48. Thus the mean gain values stored in the blocks 46 and 48 can be considered to be running averages of the mean gain for falling slope and a rising slope respectively. The fact that the circuitry is preferably disabled at maxima and minima provides a mean gain for each slope which represents a portion of the slope.

The output of each mean gain block provides the stored mean gain value of the block.

Thus when enabled, one of the mean gain blocks 48 and 46 will receive the gain value on line 68. The one of the mean gain blocks 48 and 46 which receives the gain value will adjust its held mean value in accordance with this gain value. This adjustment comprises updating the mean value to take into account the current mean value, to provide an adjusted mean value.

If the output of the gate is zero, the multiplexor is disabled and neither output of the multiplexor is set.

The outputs of the mean gain blocks 48 and 46 are combined by a subtractor/combiner 50. The subtractor/combiner thus combines the mean gain values provided by the mean gain blocks 48 and 46.

In the example illustration, the subtractor/combiner subtracts the means gain (or running average gain) on a rising slope from the mean gain (or running average) on a falling slope. Referring to FIG. 1, for example, this means that the mean gain of the slope 102 is subtracted from the mean gain of the slope 104.

This subtraction provides an indication of the difference (within the threshold dictating by the disablement around the maxima and minima) between the two mean values, including the direction (positive or negative) of that difference. In one embodiment the direction is sufficient information, and conveys information as to which direction the delay should be adjusted to mimise this difference. In another embodiment the delay is adjusted in that direction by the size of the difference. The difference represents the error, and the amount by which the delay should be adjusted.

The output of the subtractor/comparator indicates whether the input signal leads or lags the envelope signal. It can be understood that in order to make this determination, it is not necessarily required to specifically compare the timing of the input and envelope signals, and it is sufficient for example to compare two signals which represent the timing of the input and envelope signals.

If there is no error, for example if the error is reduced to zero, the difference between the average values stored in the blocks 46, 48 will be zero.

In the described example the error signal representing the delay difference between the input and envelope signals is determined in a particular way, but the invention is not limited to this. For example, with reference to FIG. 1, an instantaneous gain value (or a mean gain value) on a rising or negative slope (the slope 102 or 104) may be compared with the total average gain (represented by slope 100), and the difference between a value (or a mean value) on the slope 102 or 104 compared with the total means value on the slope 100. This similarly provided the direction and/or the value of an error. If there is no error, for example if the error is reduced to zero, the difference between the average values stored in the blocks 46, 48 and the total mean error (on the rising and falling slopes) will be zero.

Thus the output of the combiner 50 represents the combination of the values held by the two mean gain blocks 48 and 46. The output of the combiner 50 is provided as an input to a damping block 64.

The output of the damping block 64 forms the control signal on line 66, providing a control signal for the delay block 16. The control signal on line 66 indicated an adjustment to be made to the delay of delay block 16.

The above arrangement described with reference to FIG. 3 provides an exemplary implementation for implementing the present invention in which a gain control signal on line 66 provides a signal to adjust or control the gain in the envelope path.

Figure 4:
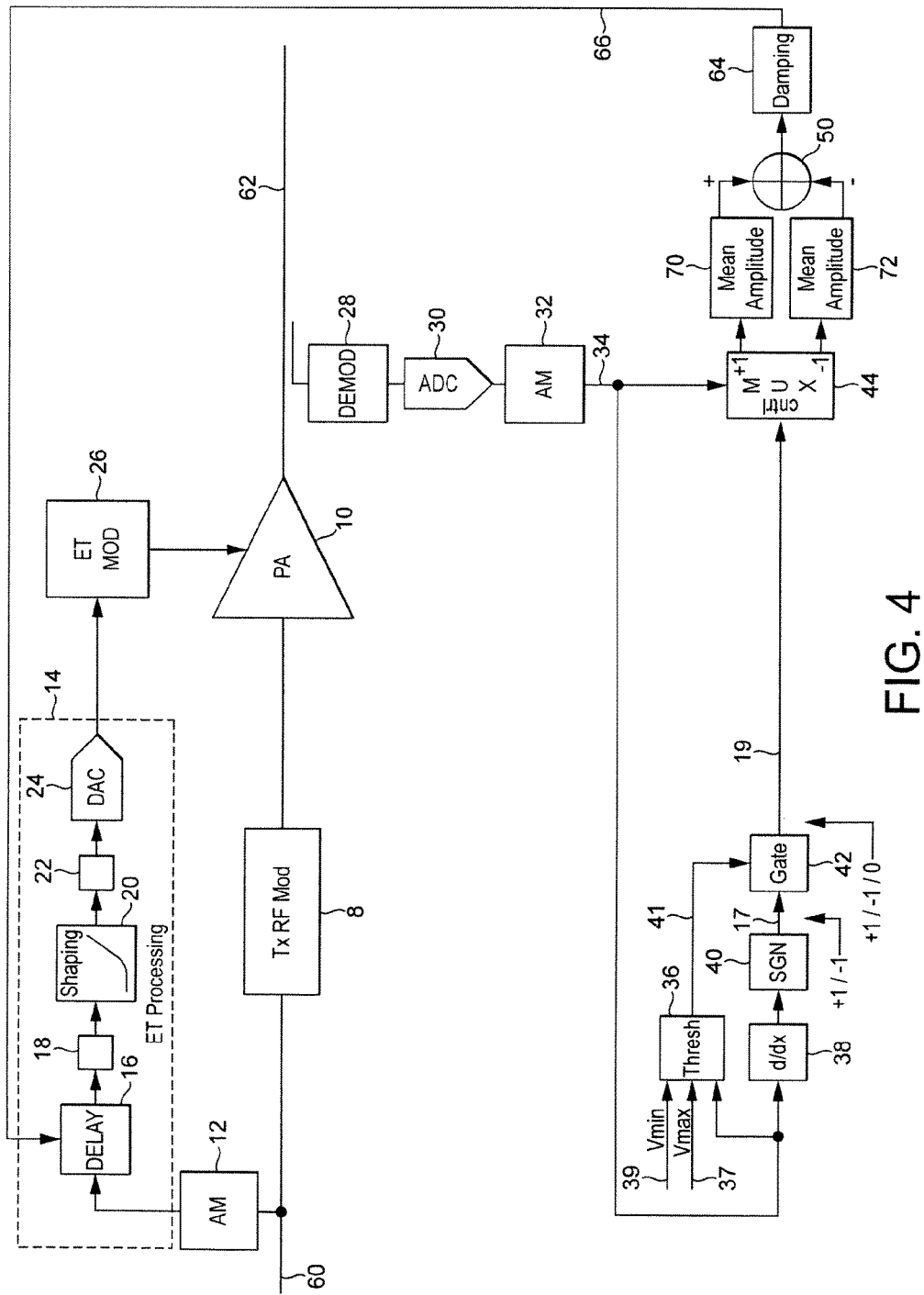
FIG. 4 illustrates an improved envelope tracking amplification stage in accordance with another exemplary implementation.

With reference to FIG. 4 there is illustrated an alternative exemplary implementation for detecting the direction of the delay error. In FIG. 4, and in all Figures, like reference numerals are used to identify elements which are functionally equivalent between the Figures.

With respect to FIG. 4 there is generally shown an arrangement which is similar to the arrangement of FIG. 1, but the processing is entirely based on the output signal of the power amplifier 10 on line 62.

A demodulated output signal is generated on line 34 as in the FIG. 3 arrangement. This signal on line 34 provides an input to the differentiator block 38 and the threshold block 36 directly, and additionally provides the value input to the multiplexer 44 directly. The threshold block 36, differentiator 38, sign block 40 and gate 42 operate as described in relation to FIG. 3, to produce a signal on line 19 to the control input of the multiplexer 44 which is either a positive (+1), a negative (−1) or zero (0).

The positive and negative outputs of the multiplexer 44 are connected respectively to a mean amplitude block 70 and a mean amplitude block 72, rather than the mean gain block 48 and mean gain block 46 of FIG. 3. In this example each of the mean amplitude blocks 70 and 72 respectively holds a value corresponding to the mean amplitude of the output signal on line 62. The mean amplitude value held in a mean amplitude block 70 or 72 is updated by adjusting the mean value to account for the value on line 34. The operation of the determination of a difference or error in this example implementation is the same as that of FIG. 3. The mean value on the rising or falling edge is compared to the mean value on the falling or rising edge respectively, and the difference represents the direction and size of the error, one or both of which pieces of information may be used to control the delay in either the input path or the envelope path.

The outputs of the mean amplitude blocks 70 and 72 are provided as inputs to the combiner 50, which provides an input to the damping block 64, which in turn provides the variable gain control signal on line 66 to the delay block 16.

The arrangement of FIG. 4 thus illustrates that it is possible to use the power amplifier output to determine the slope of the signal as well as the error in the delay.

Figure 5:
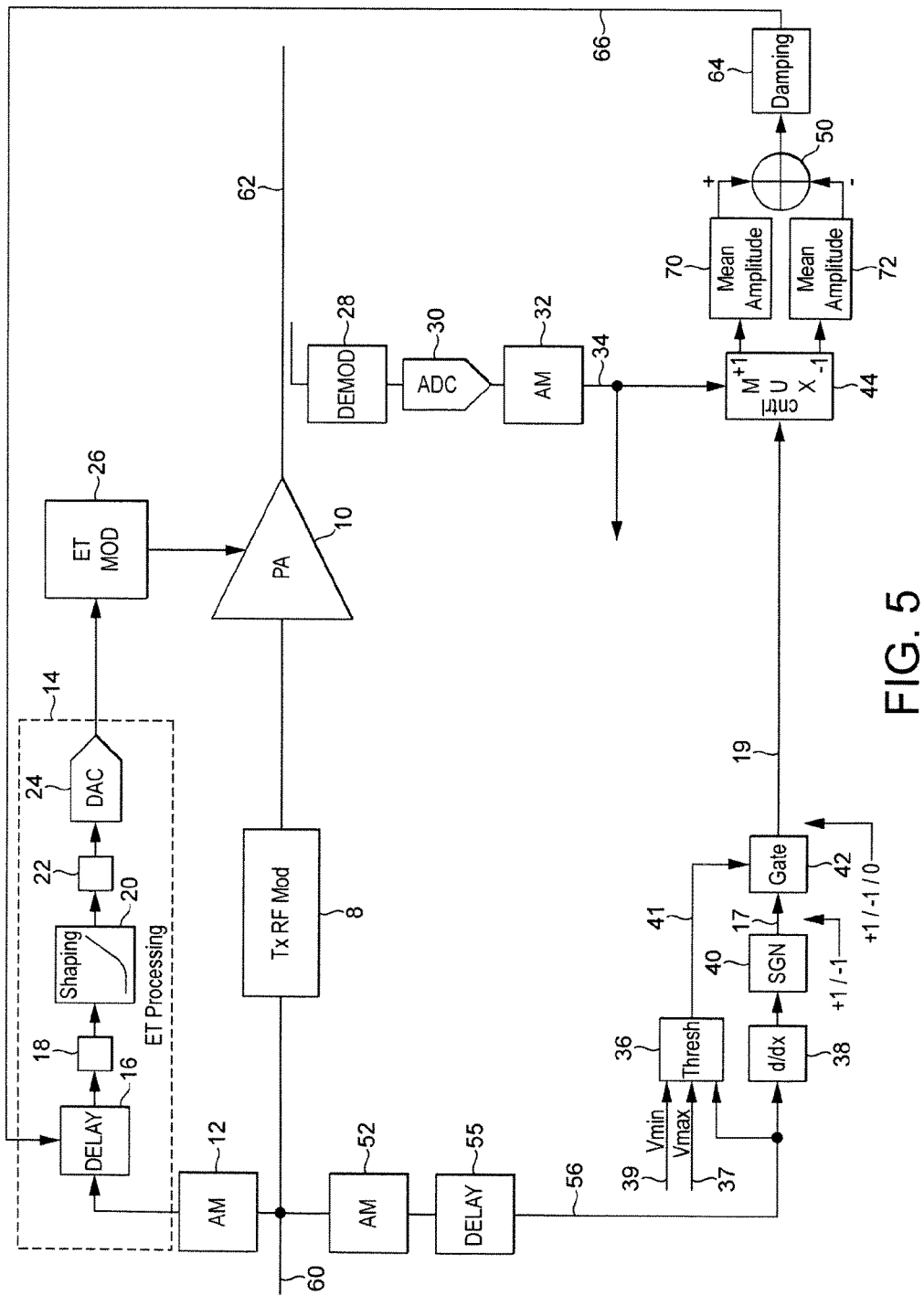
FIG. 5 illustrates an improved envelope tracking amplification stage in accordance with a further exemplary implementation.

With reference to FIG. 5 there is illustrated a still further exemplary implementation for detecting the direction of the delay error.

With reference to FIG. 5 the output of the delay block on line 56 is provided as an input to the threshold block 36 and the differentiator block 38 as in the FIG. 3 arrangement, and as in the FIG. 3 arrangement the threshold block 36, the differentiator block 38, the sign block 40 and the gate 42 operate to produce the signal on line 19. The value input for the multiplexer 44 is provided directly by the signal 34 which is demodulated from the output 62. As well as producing the value input to the multiplexer 44, the signal on line 34 is also available for power control in accordance with other application requirements.

As in the arrangement of FIG. 4, in the arrangement of If there is no error, for example if the error is reduced to zero, the difference between the average values stored in the blocks 46, 48 will be zero.

FIG. 5 the mean amplitude block 70 and the mean amplitude block 72 are provided at the outputs of the multiplexer 44, such that the mean amplitude of the output signal on either the increasing or decreasing slope is updated in dependence on the value on line 34.

The delay control signal is thus generated on line 66 in accordance with the above described techniques.

The above described arrangements illustrate techniques for implementing the invention which are neither limiting nor exhaustive.

In general it is required to provide a transmitter having an AM feedback receiver capable of capturing instantaneous signals. In an LTE implementation the sample rate for capturing instantaneous signals needs to be high enough in order to capture LTE signals. The length or size of a sample captured is not critical. A RAM for capturing instantaneous signals therefore needs to have a sufficient sample rate for the implementation, but the length/size of the is not critical.

In an exemplary implementation, a gain adjustment of the envelope tracking amplification stage can be determined by calculating a gain error of the envelope tracking amplification stage.

In an alternative implementation, the delay setting of the delay block 16 may be adjusted in dependence upon an integration of the gain error. The damping provided by the damping block 64 can be set such that ACLR is not degraded.

The exemplary solution illustrated in the Figures is advantageous in providing a closed loop system, which will therefore track temperature changes. No factory delay calibration is required, and no open loop delay correction is required.

The invention has been described herein with reference to particular advantageous embodiments and exemplary implementations. The invention is not limited to any details of any aspect of such embodiments and implementations. The scope of the invention is defined by the appending claims.

The invention claimed is:

1. An envelope tracking amplification stage comprising:
   an input path;
   an envelope path; and
   a delay stage in one of the input path and the envelope path, a delay of the delay stage being determined in dependence on a slope polarity of a signal representing an input signal and whether a signal in the input path leads or lags a signal in the envelope path.

2. The envelope tracking amplification stage of claim 1, wherein the slope polarity of the signal representing the input signal is determined by determining a slope polarity of any one of the signals in the input path, the envelope path, or an output path.

3. The envelope tracking amplification stage of claim 2, wherein the slope polarity of the signal representing the input signal is determined in dependence on a portion of the input signal which is not a minima or a maxima of the input signal.

4. The envelope tracking amplification stage of claim 1, wherein determining whether the signal in the input path leads or lags the signal in the envelope path comprises:
   comparing an instantaneous signal amplitude of the signal representing the input signal to an average signal amplitude of the signal representing the input signal.

5. The envelope tracking amplification stage of claim 4, wherein the average signal amplitude is determined in dependence on the slope polarity.

6. The envelope tracking amplification stage of claim 1, wherein determining whether the signal in the input path leads or lags the signal in the envelope path comprises:
   comparing an instantaneous signal gain of the signal representing the input signal to an average signal gain of the signal representing the input signal.

7. The envelope tracking amplification stage of claim 6, wherein the average signal gain is determined in dependence on the slope polarity.

8. A method for determining a delay in an input path or an envelope path of an envelope tracking amplification stage, the method comprising:
   determining a slope polarity of a signal representing an input signal;
   determining whether a signal in the input path leads or lags a signal in the envelope path, wherein the signal in the input path is based on the input signal; and
   determining the delay based on the slope polarity and whether the signal in the input path leads or lags the signal in the envelope path.

9. The method of claim 8, wherein determining the slope polarity of the signal representing the input signal comprises:
   determining the slope polarity of any one of the signals in the input path, the envelope path, or an output path.

10. The method of claim 9, wherein determining the slope polarity of the signal representing the input signal is based on a portion of the input signal which is not a minima or a maxima of the input signal.

11. The method of claim 8, wherein determining whether the signal in the input path leads or lags the signal in the envelope path comprises:
    comparing an instantaneous signal amplitude of the signal representing the input signal to an average signal amplitude of the signal representing the input signal.

12. The method of claim 11, wherein the average signal amplitude is determined in dependence on the slope polarity.

13. The method of claim 8, wherein determining whether the signal in the input path leads or lags the signal in the envelope path comprises:
    comparing an instantaneous signal gain of the signal representing the input signal to an average signal gain of the signal representing the input signal.

14. The method of claim 13, wherein the average signal gain is determined in dependence on the slope polarity.

* * * * *